United States Patent
Lim et al.

(10) Patent No.: US 10,355,700 B2
(45) Date of Patent: Jul. 16, 2019

(54) CLOCK DATA RECOVERY CIRCUIT, APPARATUS INCLUDING SAME AND METHOD FOR RECOVERY CLOCK AND DATA

(71) Applicant: SAMSUNG ELECTRONICS CO., LTD., Suwon-si, Gyeonggi-do (KR)

(72) Inventors: Jung-Pil Lim, Hwaseong-si (KR); Kyung-Ho Ryu, Yongin-si (KR); Jae-Suk Yu, Seoul (KR); Jae-Youl Lee, Hwaseong-si (KR); Dong-Myung Lee, Hwaseong-si (KR); Hyun-Wook Lim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/150,347

(22) Filed: Oct. 3, 2018

(65) Prior Publication Data
US 2019/0158100 A1   May 23, 2019

(30) Foreign Application Priority Data
Nov. 20, 2017  (KR) .................. 10-2017-0154977

(51) Int. Cl.
*H03L 7/085* (2006.01)
*H03L 7/081* (2006.01)
*H04L 7/04* (2006.01)
*H03L 7/08* (2006.01)

(52) U.S. Cl.
CPC .......... *H03L 7/0814* (2013.01); *H03L 7/0807* (2013.01); *H04L 7/044* (2013.01)

(58) Field of Classification Search
CPC .. H03L 7/085; H03L 2207/06; H03L 2207/50
USPC ................................. 327/147–149, 156–158
See application file for complete search history.

(56) References Cited

U.S. PATENT DOCUMENTS

| | | | |
|---|---|---|---|
| 6,212,249 B1* | 4/2001 | Shin | G11B 20/1025 375/376 |
| 6,262,634 B1* | 7/2001 | Flanagan | H03L 7/081 324/600 |
| 6,445,230 B1* | 9/2002 | Rupp | H03L 7/0991 327/151 |
| 7,474,720 B2 | 1/2009 | Yuuki et al. | |
| 7,526,049 B2 | 4/2009 | Kushiyama | |
| 8,271,823 B2 | 9/2012 | Kim | |
| 8,878,792 B2 | 11/2014 | Lim et al. | |
| 8,891,717 B1* | 11/2014 | Payne | H03L 7/00 327/147 |

(Continued)

FOREIGN PATENT DOCUMENTS

JP         2015065629 A     4/2015

*Primary Examiner* — Adam D Houston
(74) *Attorney, Agent, or Firm* — Volentine, Whitt & Francos, PLLC

(57) ABSTRACT

A method of recovering a clock and data from an input data signal including an embedded clock, the method including generating a recovery clock signal from the input data signal based on a first window signal; detecting a unit interval corresponding to one bit of the input data signal based on the recovery clock signal; delaying a signal synchronized with the recovery clock signal based on the unit interval; and generating the first window signal based on the delayed signal.

20 Claims, 13 Drawing Sheets

(56) References Cited

U.S. PATENT DOCUMENTS

| | | | |
|---|---|---|---|
| 8,977,884 B2* | 3/2015 | Sridharan | H04N 5/126 327/147 |
| 9,020,086 B2* | 4/2015 | Chen | H03L 7/085 327/147 |
| 9,124,257 B2 | 9/2015 | Desai et al. | |
| 9,407,424 B1 | 8/2016 | Holla et al. | |
| 9,960,775 B2* | 5/2018 | Ogihara | H03L 7/095 |
| 2009/0267661 A1* | 10/2009 | Ootsuki | H03L 7/183 327/156 |
| 2011/0093753 A1* | 4/2011 | Takagi | G06F 11/1004 714/746 |
| 2011/0175653 A1* | 7/2011 | Tani | G06F 1/06 327/156 |
| 2012/0139593 A1* | 6/2012 | Saito | H03L 7/087 327/156 |
| 2013/0076450 A1* | 3/2013 | Rao | H03L 7/0896 331/34 |
| 2014/0348280 A1 | 11/2014 | Huang | |
| 2015/0188550 A1* | 7/2015 | Sawada | H03B 5/366 327/156 |
| 2016/0079988 A1* | 3/2016 | Shiozaki | H03L 7/0802 327/156 |
| 2016/0191064 A1* | 6/2016 | Takeda | H03L 7/085 327/156 |
| 2018/0254964 A1* | 9/2018 | Kwan | H04L 43/087 |

\* cited by examiner

US 10,355,700 B2

CLOCK DATA RECOVERY CIRCUIT, APPARATUS INCLUDING SAME AND METHOD FOR RECOVERY CLOCK AND DATA

CROSS-REFERENCE TO RELATED APPLICATION

A claim for priority under 35 U.S.C. § 119 is made to Korean Patent Application No. 10-2017-0154977, filed on Nov. 20, 2017, in the Korean Intellectual Property Office, the entire content of which is hereby incorporated by reference.

BACKGROUND

The present inventive concepts relate to clock data recovery, and more particularly to a clock data recovery circuit, a device including the same, and a clock data recovery method.

Serial data communication may be used to transmit data at high speed. Serial data communication may be used by various applications not only for communication between independent devices via detachable ports, but also for communication between components included in a system, for transfer of data within an integrated circuit, and for other applications.

In serial data communication, a transmitting circuit may transmit a series of bits to a receiving circuit, each bit having a duration of a unit interval (UI) that the receiving circuit may recognize. However, as data transmission rate increases, a unit interval may be shortened, and thus it may not be easy for the receiving circuit to accurately capture a series of bits.

SUMMARY

Embodiments of the inventive concepts provide clock data recovery, and more particularly provide a clock data recovery circuit for accurately recovering a clock and data from an input data signal, a device including the same, and a clock data recovery method.

Embodiments of the inventive concepts provide a clock data recovery circuit that receives an input data signal including an embedded clock. The clock data recovery circuit includes a clock recovery circuit configured to generate a recovery clock signal from the input data signal based on a first window signal and to generate a second window signal synchronized with the recovery clock signal from the first window signal; a delayed locked loop circuit configured to detect a unit interval corresponding to one bit of the input data signal based on the recovery clock signal and to generate a third window signal by delaying the second window signal based on the unit interval; and a window generating circuit configured to generate the first window signal based on the third window signal and the recovery clock signal. The delayed locked loop circuit is configured to generate the third window signal as having a phase identical to a phase of the recovery clock signal, based on the second window signal and the recovery signal provide by the clock recovery circuit responsive to the first window signal.

Embodiments of the inventive concepts further provide a clock data recovery circuit that receives an input data signal including an embedded clock. The clock data recovery circuit includes a clock recovery circuit configured to generate a recovery clock signal by extracting periodic edges from the input data signal based on a first window signal and to generate a second window signal synchronized with the recovery clock signal from the first window signal; a delayed locked loop circuit configured to detect a unit interval corresponding to one bit of the input data signal based on the recovery clock signal and to generate a plurality of delayed clock signals by delaying the recovery clock signal; and a window generating circuit configured to generate the first window signal based on the second window signal and a delayed clock signal from among the plurality of delayed clock signals. The delayed locked loop circuit is configured to generate the delayed clock signal as having a phase identical to a phase of the second window signal, based on the recovery clock signal provided by the clock recovery circuit responsive to the first window signal.

Embodiments of the inventive concepts still further provide a method of recovering a clock and data from an input data signal including an embedded clock, the method including generating, by a clock recovery circuit, a recovery clock signal from the input data signal based on a first window signal; detecting, by a delayed locked loop circuit, a unit interval corresponding to one bit of the input data signal based on the recovery clock signal; delaying, by the delayed locked loop circuit, a signal synchronized with the recovery clock signal based on the unit interval; and generating, by a window generating circuit, the first window signal based on the delayed signal.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF THE EMBODIMENTS

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
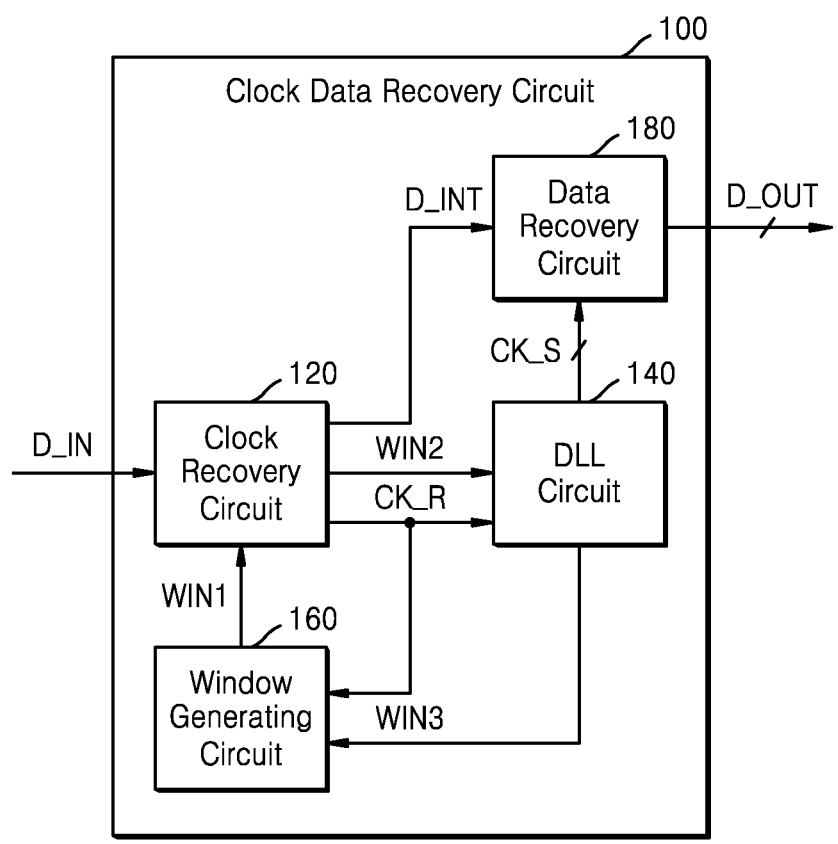
FIG. 1 illustrates a block diagram of a clock data recovery circuit according to an embodiment of the inventive concepts.
Figure 2:
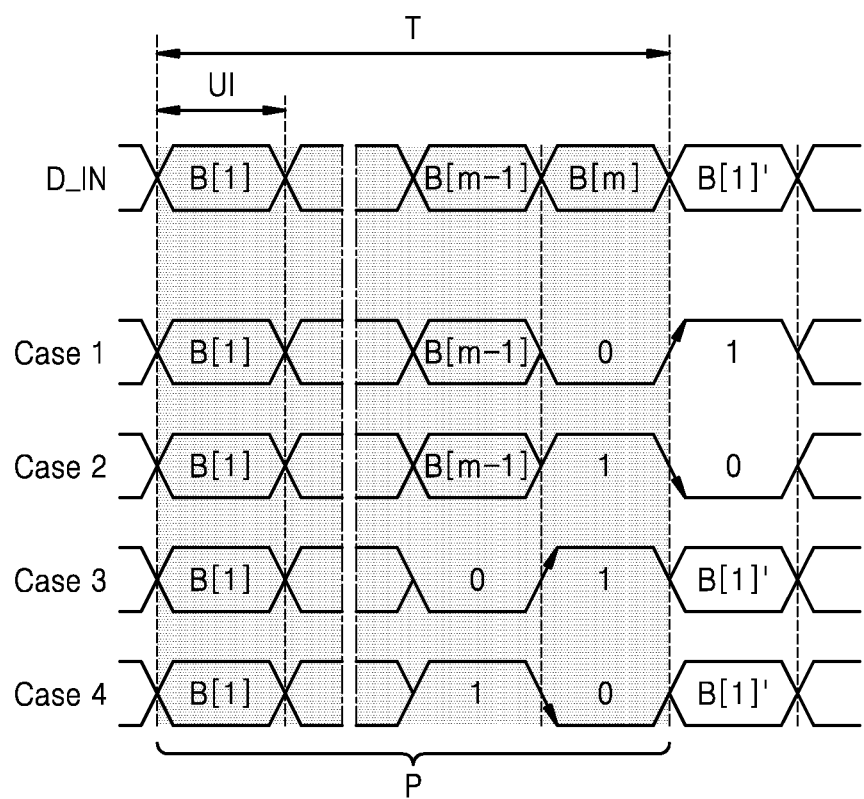
FIG. 2 illustrates a timing diagram of an example of an input data signal of FIG. 1 according to an embodiment of the inventive concepts.

FIG. 1 illustrates a block diagram of a clock data recovery circuit 100 according to an embodiment of the inventive concepts. FIG. 2 illustrates a timing diagram of an example of an input data signal D_IN of FIG. 1 according to an embodiment of the inventive concepts. In some embodiments, the clock data recovery circuit 100 of FIG. 1 may be fabricated by a semiconductor process, and may for example be included in a semiconductor device as an integrated circuit. The clock data recovery circuit 100 may be included in a receiving circuit for serial data communication, may receive the input data signal D_IN transmitted by a transmitting circuit for serial data communication, and may generate an output data signal D_OUT.

Referring to FIG. 2, the input data signal D_IN may include a series of bits, that is, a bit sequence. For example, as shown in FIG. 2, the input data signal D_IN may include a packet P of m bits sequentially received, whereby m is an integer greater than 1. The input data signal D_IN may include the packet P having a time duration T, and the packet P may include a bit sequence of m bits B[1], . . . , B[m-1], and B[m]. An interval corresponding to one bit in the bit sequence B[1] through B[m] may be referred to as a unit interval (UI). In the present specification, a UI may refer to an interval corresponding to one bit of a bit sequence included in the input data signal D_IN. The clock data recovery circuit 100 may recognize serial data included in the input data signal D_IN by capturing a bit sequence included in the input data signal D_IN packet P, by packet P, and generate an output data signal D_OUT including parallel data from the serial data.

In some embodiments, the input data signal D_IN may include a clock as well as serial data. When a data signal including serial data is received from the transmitting circuit through a data line and a clock signal is received separately through a clock line, due to various factors it may not be easy for the receiving circuit to accurately receive the data signal and the clock signal, which are synchronized with each other, and there thus may be limits on increasing the data transmission rate. On the other hand, when the transmitting circuit includes a clock in a data signal, and the receiving circuit recovers the clock included in the data signal and recognizes the serial data using the clock, the receiving circuit may capture a bit sequence by recovering a clock including variation of a data signal, and thus data transmission speed may be improved. A clock included in a data signal may be referred to as an embedded clock. To include an embedded clock in the input data signal D_IN, a packet P including a bit sequence representing serial data and at least one dummy bit for the embedded clock may be used. The dummy bit may generate an edge in the input data signal D_IN periodically (e.g., for every duration T of the packet P) and the clock data recovery circuit 100 may detect the periodic edges included in the input data signal D_IN, thereby recovering a clock.

In some embodiments, as shown in the first and second cases of FIG. 2, the packet P may include a bit sequence of (m-1) bits B[1] through B[m-1] and one dummy bit B[m]. The dummy bit B[m] may generate an edge at the boundary of the packet P, because the level of a first bit B[1]' of a packet subsequent to the packet P is inverted with respect to the level of the dummy bit B[m]. For example, as in the first case, when the first bit B[1]' of the packet subsequent to the packet P has a value of "1", that is, a high level, the dummy bit B[m] may have a value of '0', that is, a low level. Therefore, a rising edge may occur at the boundary of the packet P. Furthermore, as in the second case, when the first bit B[1]' of the packet subsequent to the packet P has a value of '0', that is, a low level, the dummy bit B[m] may have a value of '1', that is, a high level. Therefore, a falling edge may occur at the boundary of the packet P.

In some embodiments, as shown in third and fourth cases of FIG. 2, the packet P may include a bit sequence of (m-2) bits B[1] through B[m-2] (not shown) indicating serial data and two dummy bits B[m-1] and B[m], wherein the two dummy bits B[m-1] and B[m] may form an edge in the packet P. For example, as in the third case, the dummy bits B[m-1] and B[m] may have values of '0' and '1', respectively, and thus a rising edge may occur between the dummy bits B[m-1] and B[m]. Furthermore, as in the fourth case, the dummy bits B[m-1] and B[m] may have values of '1' and '0', respectively, and thus a falling edge may occur between the dummy bits B[m-1] and B[m].

To recover an embedded clock included in the input data signal D_IN, the clock data recovery circuit 100 may detect edges generated by at least one dummy bit. Since the input data signal D_IN includes not only edges due to dummy bits, but also edges due to serial data, the clock data recovery circuit 100 may use a window signal (e.g., WIN1 of FIG. 1)

for extracting only edges due to dummy bits. A window signal may have an active pulse, the active pulse having an interval (e.g., a pulse width) overlapping an edge to detect, and only edges included in the interval corresponding to the active pulse of the window signal (or active interval) may be detected.

As the UI is shortened, the timing of the window signal for extracting only edges due to dummy bits needs to be precisely controlled. As described below, the clock data recovery circuit 100 according to an example embodiment of the inventive concepts is independent of a process voltage temperature (PVT) and a transmission rate. Furthermore, by generating a window signal that is adaptively synchronized with the input data signal D_IN, an embedded clock, and data may be precisely recovered from the input data signal D_IN. Hereinafter, example embodiments will be described with reference to a case where the packet P includes a 13-bit bit sequence (i.e., m=13) and, as in the first and second cases of FIG. 2, the input data signal D_IN includes an edge generated at the boundary of the packet P by one dummy bit B[m] or B[13]. However, example embodiments may be applied to various types of input data signal D_IN, such as for example a case that the input data signal D_IN includes an edge generated at the boundary of the data packet by two dummy bits.

Referring to FIG. 1, the clock data recovery circuit 100 includes a clock recovery circuit 120, a delayed locked loop (DLL) circuit 140, a window generating circuit 160, and a data recovery circuit 180. The clock recovery circuit 120 receives the input data signal D_IN from a device outside (external of) the clock data recovery circuit 100 and receives a first window signal WIN1 from the window generating circuit 160. The clock recovery circuit 120 extracts periodic edges from the input data signal D_IN based on the first window signal WIN1 and generates a recovery clock signal CK_R based on the extracted edges. In some embodiments, the recovery clock signal CK_R may have rising edges (or falling edges) corresponding to the extracted edges and may have a same period as a duration T of the packet P.

Furthermore, the clock recovery circuit 120 generates a second window signal WIN2 synchronized with the recovery clock signal CK_R from the first window signal WIN1, and generates an internal data signal D_INT synchronized with the recovery clock signal CK_R from the input data signal D_IN. A phase difference between two or more mutually synchronized signals stated above may be maintained constant. Since the recovery clock signal CK_R generated from the input data signal D_IN may have a timing different from that of the input data signal D_IN, the clock recovery circuit 120 may generate the internal data signal D_INT and the second window signal WIN2 from the input data signal D_IN and the first window signal WIN1. For example, the edge of the recovery clock signal CK_R (e.g., a rising edge) may be substantially identical to a bit transition time of the internal data signal D_INT, and the second window signal WIN2 (i.e., an active pulse of the second window signal WIN2) may include (e.g., overlap) the edge of the recovery clock signal CK_R. Examples of the clock recovery circuit 120 will be described below with reference to FIGS. 3 and 4.

The DLL circuit 140 receives the recovery clock signal CK_R and the second window signal WIN2 from the clock recovery circuit 120. The DLL circuit 140 generates a plurality of delayed clock signals by delaying the recovery clock signal CK_R, and generates a third window signal WIN3 by delaying the second window signal WIN2. The DLL circuit 140 detects a UI corresponding to one bit of the input data signal D_IN by using the recovery clock signal CK_R, and delays the recovery clock signal CK_R and the second window signal WIN2 based on the detected UI. As the third window signal WIN3 is delayed based on the detected unit interval UI, the first window signal WIN1 used by the clock recovery circuit 120 may have a correct timing for extracting an edge. In some embodiments, the first, second, and third window signals WIN1, WIN2, and WIN3 may have active pulses corresponding to the UI.

The plurality of delayed clock signals generated by the DLL circuit 140 may include sample clock signals CK_S having phase differences with respect to one another, wherein the phase differences correspond to multiples of the UI. The DLL circuit 140 provides the sample clock signals CK_S to the data recovery circuit 180. Examples of the DLL circuit 140 will be described below with reference to FIGS. 5 through 7.

The window generating circuit 160 receives the recovery clock signal CK_R from the clock recovery circuit 120, and receives the third window signal WIN3 from the DLL circuit 140. The window generating circuit generates the first window signal WIN1, such that the phase of the recovery clock signal CK_R will be identical to the phase of the third window signal WIN3. As the second window signal WIN2 synchronized with the recovery clock signal CK_R, that is the second window signal WIN2 having an active pulse of an interval including (overlapping) an edge of the recovery clock signal CK_R, is delayed by the DLL circuit 140 based on the UI, the third window signal WIN3 may have a constant phase difference with respect to the recovery clock signal CK_R.

In some embodiments, the window generating circuit 160 generates the first window signal WIN1, such that the phase of the recovery clock signal CK_R will be identical to the phase of the third window signal WIN3. Therefore, when the phase of the recovery clock signal CK_R leads the phase of the third window signal WIN3, the edge of the active pulse of the first window signal WIN1 may lead the periodic edges of the input data signal D_IN. In other words, the edge of the active pulse of the first window signal WIN1 may have a phase difference with respect to the edge of the input data signal D_IN, the phase difference equivalent to the phase difference between the recovery clock signal CK_R and the third window signal WIN3. For example, when the third window signal WIN3 provided by the DLL circuit 140 has a phase 0.5 UI (i.e., half the unit interval) delayed from that of the recovery clock signal CK_R, the first window signal WIN1 may have a phase that leads the phase of the input data signal D_IN by approximately 0.5 UI. As a result, the timing of the first window signal WIN1 used for detecting an embedded clock may depend on the third window signal WIN3 generated by the DLL circuit 140, and, as the DLL circuit 140 generates the third window signal WIN3 based on the UI detected from the recovery clock signal CK_R recovered from the input data signal D_IN, the first window signal WIN1 may follow a variation of the input data signal D_IN, e.g., a temporary or non-temporary delay. Examples of the window generating circuit 160 will be described below with reference to FIGS. 8 and 9. In other words, the DLL circuit 140 generates the third window signal WIN3 as having a phase identical to a phase of the recovery clock signal CK_R, based on the second window signal WIN2 and the recovery clock signal CK_R provided by the clock recovery circuit 120 responsive to the first window signal WIN1 as provided to the clock recovery circuit 120 by the window generating circuit 160.

The data recovery circuit 180 receives the internal data signal D_INT from the clock recovery circuit 120, and receives the sample clock signals CK_S from the DLL circuit 140. The data recovery circuit 180 outputs the output data signal D_OUT including parallel data, from the internal data signal D_INT including serial data, based on the sample clock signals CK_S. For example, the data recovery circuit 180 may include a plurality of flip-flops that receive the respective sample clock signals CK_S and receive the internal data signal D_INT, and the output data signal D_OUT may be generated from output signals of the plurality of flip-flops. As described above, the sample clock signals CK_S may have phase differences with respect to one another, wherein the phase differences correspond to multiples of the UI, based on the UI detected by the DLL circuit 140. Therefore, the data recovery circuit 180 may capture the input data signal D_IN from each of edges (e.g., rising edges) of the sample clock signals CK_S, thereby outputting the output data signal D_OUT. The data recovery circuit 180 may also be referred to as a data sampling circuit.

Figure 3:
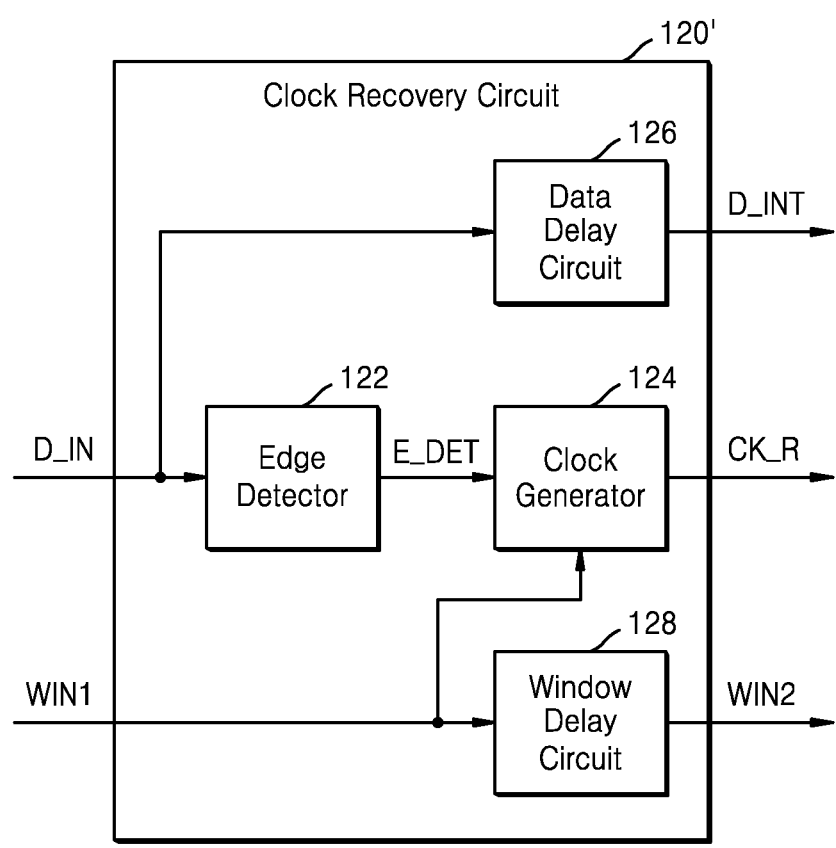
FIG. 3 illustrates a block diagram of an example of a clock recovery circuit of FIG. 1 according to an embodiment of the inventive concepts.
Figure 4:
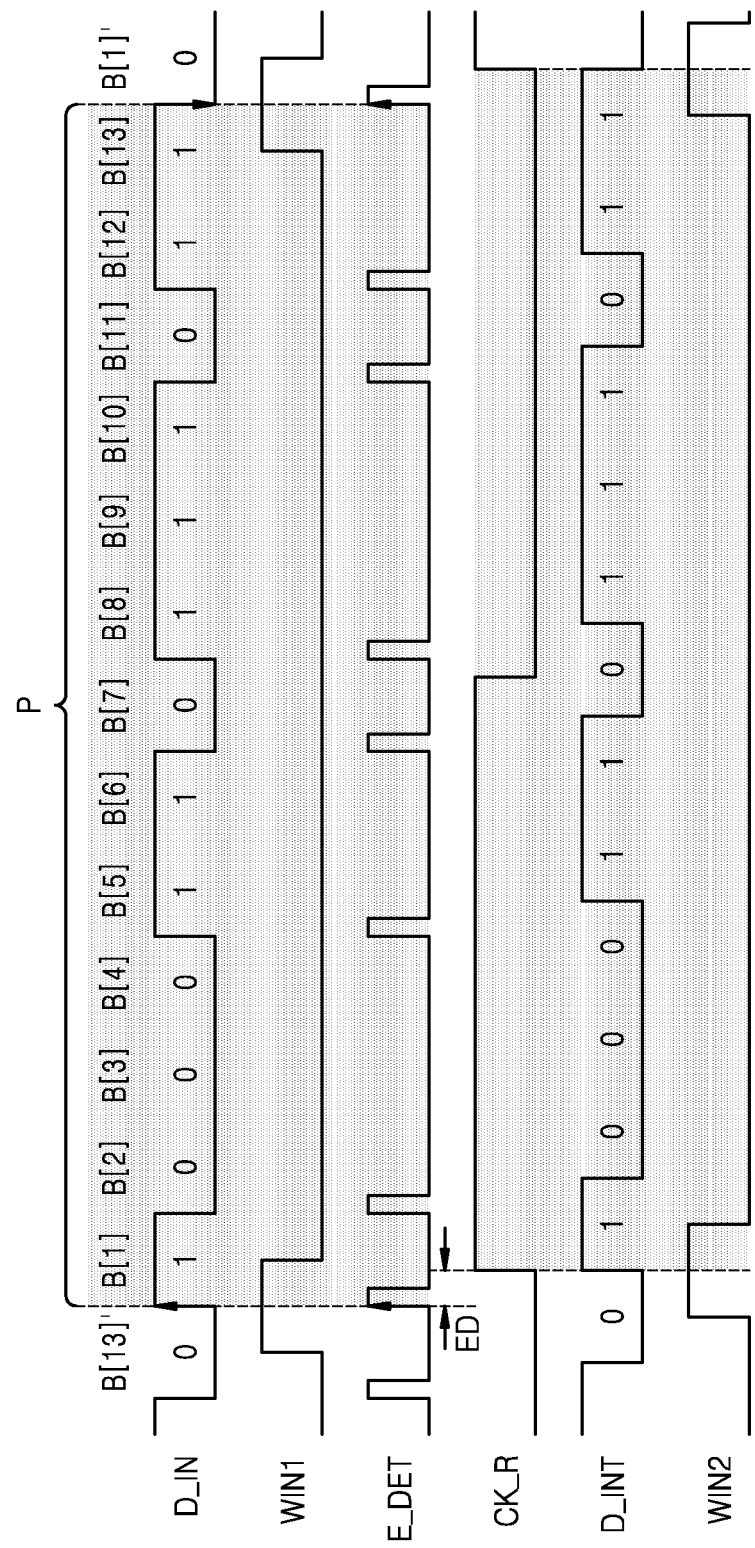
FIG. 4 illustrates a timing diagram of an example of the operation of the clock recovery circuit of FIG. 3 according to an embodiment of the inventive concepts.

FIG. 3 illustrates a block diagram of an example of the clock recovery circuit 120 of FIG. 1 according to an embodiment of the inventive concepts. FIG. 4 illustrates a timing diagram of an example of the operation of the clock recovery circuit 120' of FIG. 3 according to an embodiment of the inventive concepts. As described above with reference to FIG. 1, the clock recovery circuit 120' of FIG. 3 receives the input data signal D_IN and the first window signal WIN1, and outputs the recovery clock signal CK_R, the second window signal WIN2, and the internal data signal D_INT. As shown in FIG. 3, the clock recovery circuit 120' includes an edge detector 122, a clock generator 124, a data delay circuit 126, and a window delay circuit 128. The window delay circuit 128 included in the clock recovery circuit 120' will be referred to hereinafter as a first window delay circuit 128 to distinguish the same from the other window delay circuits of the clock data recovery circuit 100 of FIG. 1.

The edge detector 122 receives the input data signal D_IN and outputs an edge detect signal E_DET by detecting edges included in the input data signal D_IN. For example, as shown in FIG. 4, the edge detector 122 may generate the edge detect signal E_DET including active pulses having rising edges at rising edges and falling edges of the input data signal D_IN. In the example of FIG. 4, the delay between an edge of the input data signal D_IN and a corresponding edge of the edge detect signal E_DET is assumed to be substantially zero (0).

The clock generator 124 receives the edge detect signal E_DET from the edge detector 122 and receives the first window signal WIN1. The clock generator 124 extracts periodic edges from the edge detect signal E_DET by using the first window signal WIN1 and generates the recovery clock signal CK_R according to the extracted periodic edges. Referring to FIG. 4, the first window signal WIN1 may include an active pulse of an interval including (i.e., overlapping) only edges generated at the boundary of the packet P. Accordingly, the clock generator 124 may extract periodic edges indicated by an arrow (↑) from among edges of the edge detect signal E_DET and may generate the recovery clock signal CK_R from the extracted periodic edges indicated by an arrow (↑). The recovery clock signal CK_R may have rising edges at (e.g., located based on) the extracted periodic edges indicated by an arrow (↑), and thus the recovery clock signal CK_R may have a period identical to the duration of the packet P. That is, the clock generator 124 may generate the recovery clock signal CK_R by extracting an edge, from among the detected edges of the edge detect signal E_DET, that overlaps an active interval of the first window signal WIN1.

The edges of the recovery clock signal CK_R may be delayed from the corresponding edges of the edge detect signal E_DET. For example, the clock generator 124 may include at least one logic gate to which the edge detect signal E_DET is input or a signal generated from the edge detect signal E_DET and the first window signal WIN1 is input, and the edge of the recovery clock signal CK_R may be delayed from the edge of the edge detect signal E_DET due to a gate delay of the at least one logic gate. As shown in FIG. 4, the delay from an edge of the edge detect signal E_DET to a corresponding edge of the recovery clock signal CK_R may be indicated as an edge delay ED and may be referred to as a propagation delay of the clock generator 124.

The data delay circuit 126 generates the internal data signal D_INT synchronized with the recovery clock signal CK_R, and the first window delay circuit 128 generates the second window signal WIN2 synchronized with the recovery clock signal CK_R. As described below, the other components included in the clock data recovery circuit 100 of FIG. 1 including the DLL circuit 140, the data recovery circuit 180, and the window generating circuit 160 may also operate in synchronization with the recovery clock signal CK_R, and thus the second window signal WIN2 and the internal data signal D_INT, which are provided to the other components, may also be needed to be synchronized with the recovery clock signal CK_R.

In some embodiments, the data delay circuit 126 may generate the internal data signal D_INT by providing (e.g., applying) a delay corresponding to the propagation delay of the clock generator 124 to the input data signal D_IN. Furthermore, in some embodiments, the first window delay circuit 128 may generate the second window signal WIN2 by providing (e.g., applying) a delay corresponding to the propagation delay of the clock generator 124 to the first window signal WIN1. Therefore, as shown in FIG. 4, the internal data signal D_INT may be delayed from the input data signal D_IN by the edge delay ED, and the second window signal WIN2 may be delayed from the first window signal WIN1 by the edge delay ED. In other words, the second window signal WIN2 may be generated by the first window delay circuit 128 by delaying the first window signal WIN1 by a phase difference between the edge detect signal E_DET and the recovery clock signal CK_R, which phase difference may correspond to the edge delay ED referred to as a propagation delay of the clock generator 124.

Figure 5:
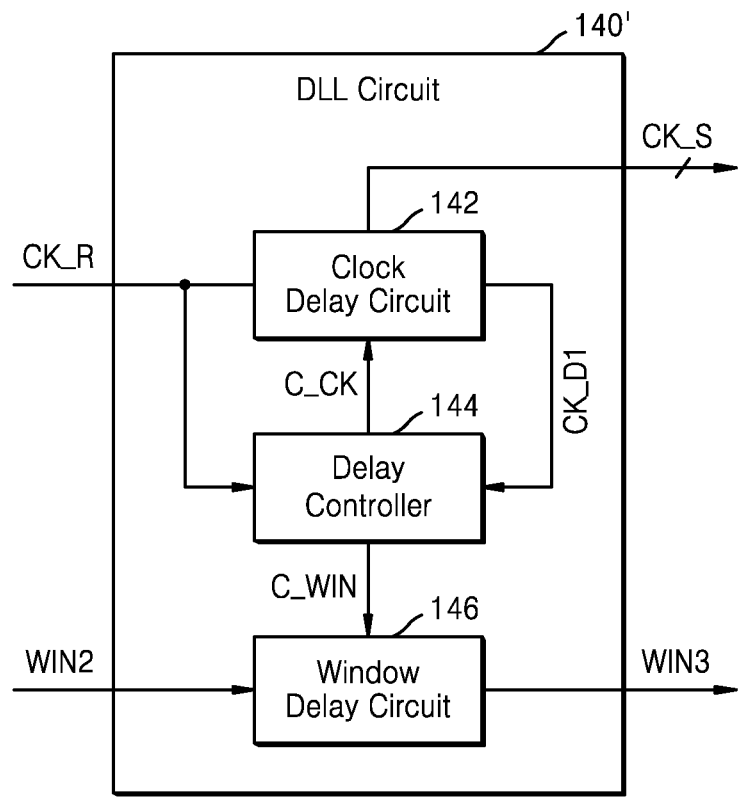
FIG. 5 illustrates a block diagram of an example of a DLL circuit of FIG. 1 according to an embodiment of the inventive concepts.
Figure 6:
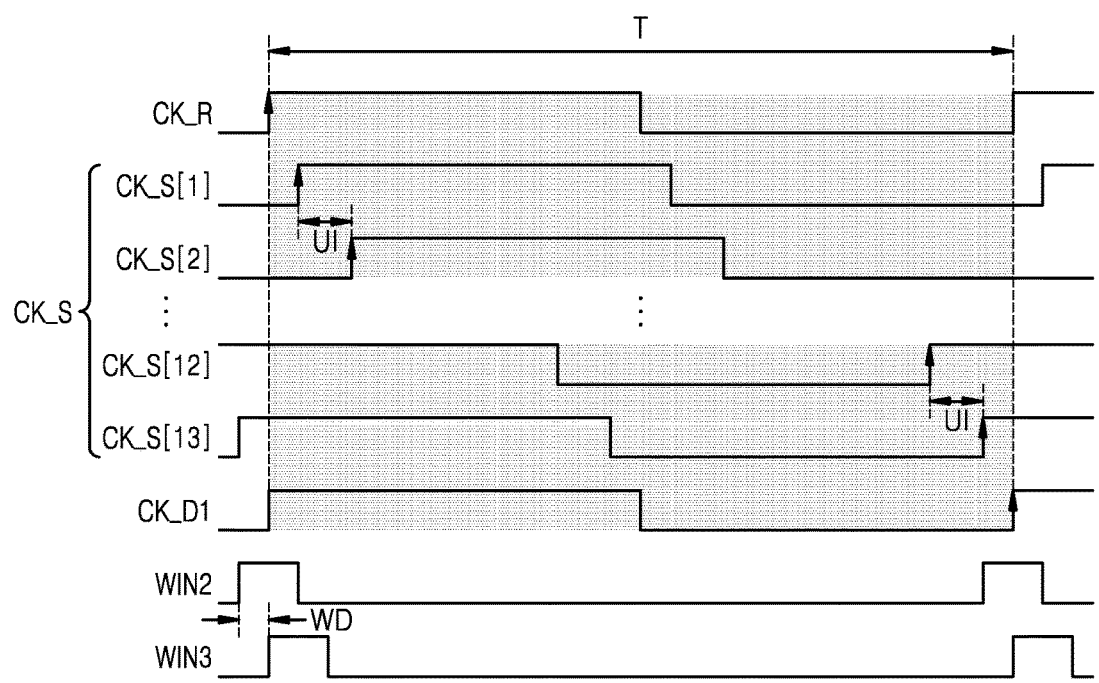
FIG. 6 illustrates a timing diagram of an example of the operation of the DLL circuit of FIG. 5.

FIG. 5 illustrates a block diagram of an example of a DLL circuit 140 of FIG. 1 according to an embodiment of the inventive concepts. FIG. 6 illustrates a timing diagram of an example of the operation of the DLL circuit 140' of FIG. 5. As described above with reference to FIG. 1, the DLL circuit 140' of FIG. 5 detects a UI. Based on the detected unit interval UI, the DLL circuit 140' generates a plurality of delayed clock signals CK_D1 and CK_S by delaying the recovery clock signal CK_R and generates the third window signal WIN3 by delaying the second window signal WIN2. As shown in FIG. 5, the DLL circuit 140' includes a clock delay circuit 142, a delay controller 144, and a window delay circuit 146. The window delay circuit 146 included in the DLL circuit 140' will be referred to hereinafter as a second window delay circuit 146 to distinguish the same from the other window delay circuits of the clock data recovery circuit 100 of FIG. 1.

The clock delay circuit 142 generates a plurality of delayed clock signals CK_D1 and CK_S by delaying the recovery clock signal CK_R. For example, the clock delay circuit 142 may include a series of delay units and may provide output signals of the delay units to the outside (i.e., external of clock delay circuit 142). The clock delay circuit 142 receives a clock control signal C_CK from the delay controller 144 and adjusts a delay according to the clock control signal C_CK. In some embodiments, the clock delay circuit 142 may include a series of delay units that have the same structure and receive the clock control signal C_CK in common, and thus the plurality of delayed clock signals CK_D1 and CK_S may be adjusted evenly according to the clock control signal C_CK.

The clock delay circuit 142 provides a first delayed clock signal CK_D1 from among the plurality of delayed clock signals including delayed clock signal CK_D1 and delayed clock signals CK_S to the delay controller 144. Furthermore, the clock delay circuit 142 outputs sample clock signals CK_S having phase differences with respect to one another from among the plurality of delayed clock signals CK_D1 and CK_S, wherein the phase differences are equivalent to multiples of the UI. For example, as shown in FIG. 6, the sample clock signals CK_S may include first through thirteen sample clock signals CK_S [1], CK_S[2] through CK_S[12], and CK_S[13]. For example, a first sample clock signal CK_S[1] and a second clock signal CK_S [2] may have a phase difference equivalent to the UI. As a further example, a twelfth sample clock signal CK_S [12] and a thirteenth sample clock signal CK_S [13] may also have a phase difference equivalent to the UI. The sample clock signals CK_S may be used to capture bits included in the internal data signal D_INT. In some embodiments, an output of the thirteenth sample clock signal CK_S [13] corresponding to a dummy bit B[13] may be omitted. Furthermore, in some embodiments, a first delayed clock signal CK_D1 may be one of the sample clock signals CK_S. As described herein, the sample clock signals CK_S and the first delayed clock signal CK_D1 may be collectively referred to as delayed clock signals. An example of the clock delay circuit 142 will be described later with reference to FIG. 7.

The delay controller 144 may include a phase detector, and may generate control signals C_CK and C_WIN based on a phase difference between the recovery clock signal CK_R and the first delayed clock signal CK_D1. In some embodiments, the delay controller 144 generates the clock control signal C_CK, such that the phase of the recovery clock signal CK_R is identical to that of the first delayed clock signal CK_D1, and a window control signal C_WIN may be generated based on the clock control signal C_CK. When the phase of the recovery clock signal CK_R is identical to that of the first delayed clock signal CK_D1, a delay from the recovery clock signal CK_R to the first delayed clock signal CK_D1 may be identical to a multiple of a duration of a packet, and thus a UI may be detected. For example, the first delayed clock signal CK_D1 may be generated as the recovery clock signal CK_R passes through a series of delay units corresponding in number to a multiple (k*m, k is an integer greater than 0) of the number m of bits of a bit sequence of the input data signal D_IN. Accordingly, when the delay from the recovery clock signal CK_R to the first delayed clock signal CK_D1 is identical to a duration of a packet, k delay units may each provide a delay corresponding to a UI.

The delay controller 144 may recognize the UI through the clock control signal C_CK that matches the phase of the recovery clock signal CK_R to the phase of the first delayed clock signal CK_D1. The delay controller 144 provides the window control signal C_WIN to the second window delay circuit 146, such that the second window signal WIN2 is delayed by an interval based on the UI, based on the clock control signal C_CK. In some embodiments, the clock control signal C_CK may be identical to the window control signal C_WIN.

Figure 7:
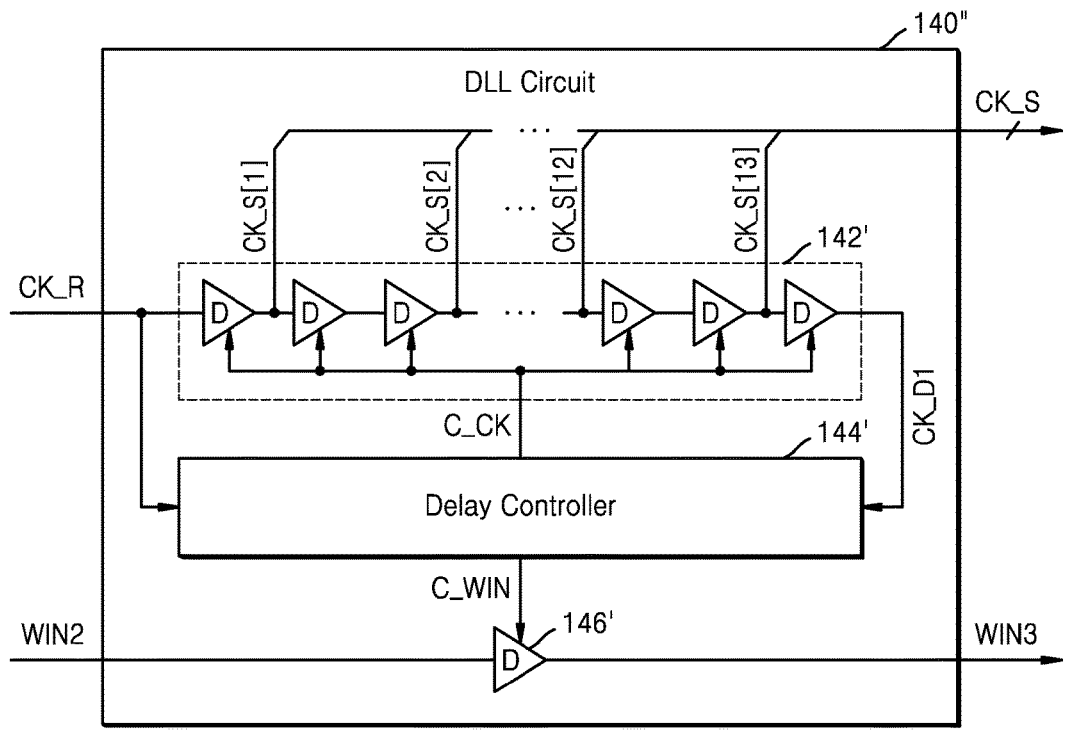
FIG. 7 illustrates a block diagram of an example of the DLL circuit of FIG. 1 according to an embodiment of the inventive concepts.

The second window delay circuit 146 generates the third window signal WIN3 by delaying the second window signal WIN2 based on the window control signal C_WIN provided from the delay controller 144. For example, as shown in FIG. 6, the third window signal WIN3 may be delayed from the second window signal WIN2 by a window delay WD. An example of the second window delay circuit 146 will be described below with reference to FIG. 7. For example, the third window signal WIN3 may be delayed from the second window signal WIN2 by approximately 0.5 unit interval (UI). FIG. 7 illustrates a block diagram of an example of the DLL circuit 140 of FIG. 1 according to an example embodiment. In detail, FIG. 7 shows a DLL circuit 140" that generates the third window signal WIN3 by delaying the second window signal WIN2 by 0.5 UI. As described above with reference to FIGS. 1 and 5, the DLL circuit 140" of FIG. 7 detects a UI and delays the second window signal WIN2 based on the detected UI. As shown in FIG. 7, the DLL circuit 140" includes a clock delay circuit 142', a delay controller 144', and a second window delay circuit 146'.

The clock delay circuit 142' includes a series of delay units D. As described above with reference to FIG. 5, the clock delay circuit 142' may include "k*m" delay units D, and the delay units D may be connected in series. As shown in FIG. 7, the clock delay circuit 142' may include 26 delay portions D (i.e., m=13 and k=2) connected in series. The delay units D receive the clock control signal C_CK from the delay controller 144' in common and provide a delay according to the clock control signal C_CK.

When the clock control signal C_CK is provided by the delay controller 144' such that the phase of the recovery clock signal CK_R is identical to that of the first delayed clock signal CK_D1, a delay provided by the 26 delay units D connected in series may be identical to the duration of the recovery clock signal CK_R, that is, a duration T of a packet. Furthermore, since the 26 delay units D have a same structure and receive the clock control signal C_CK in common, the delay provided by two delay units D is substantially identical to the UI. Similarly, a delay substantially identical to 0.5 UI is provided by one delay unit D of the clock delay circuit 142'. Therefore, as shown in FIG. 7, each of the sample clock signals CK_S is output at the interval of two delay units D, and each of the sample clock signals CK_S has a phase difference equivalent to a multiple of the UI. Furthermore, the first delayed clock signal CK_D1 may be generated as the recovery clock signal CK_R passes through the 26 delay units D.

The second window delay circuit 146' may include the delay units D that are the same as those included in the clock delay circuit 142'. Therefore, when the window control signal C_WIN is identical to the clock control signal C_CK, the delay units D of the second window delay circuit 146' provide a delay substantially identical to that provided by the delay units D of the clock delay circuit 142. In some embodiments, the second window delay circuit 146' may include "k/2" delay units D to delay the second window signal WIN2 by 0.5 UI (that is, WD=0.5 UI). For example, as shown in FIG. 7, the second window delay circuit 146' may include one delay unit D (i.e., k=2).

Figure 8:
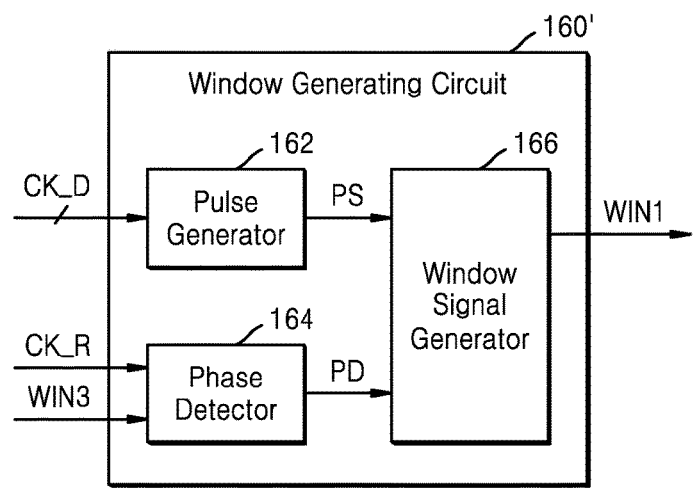
FIG. 8 illustrates a block diagram of an example of a window generating circuit of FIG. 1 according to an embodiment of the inventive concepts.
Figure 9:
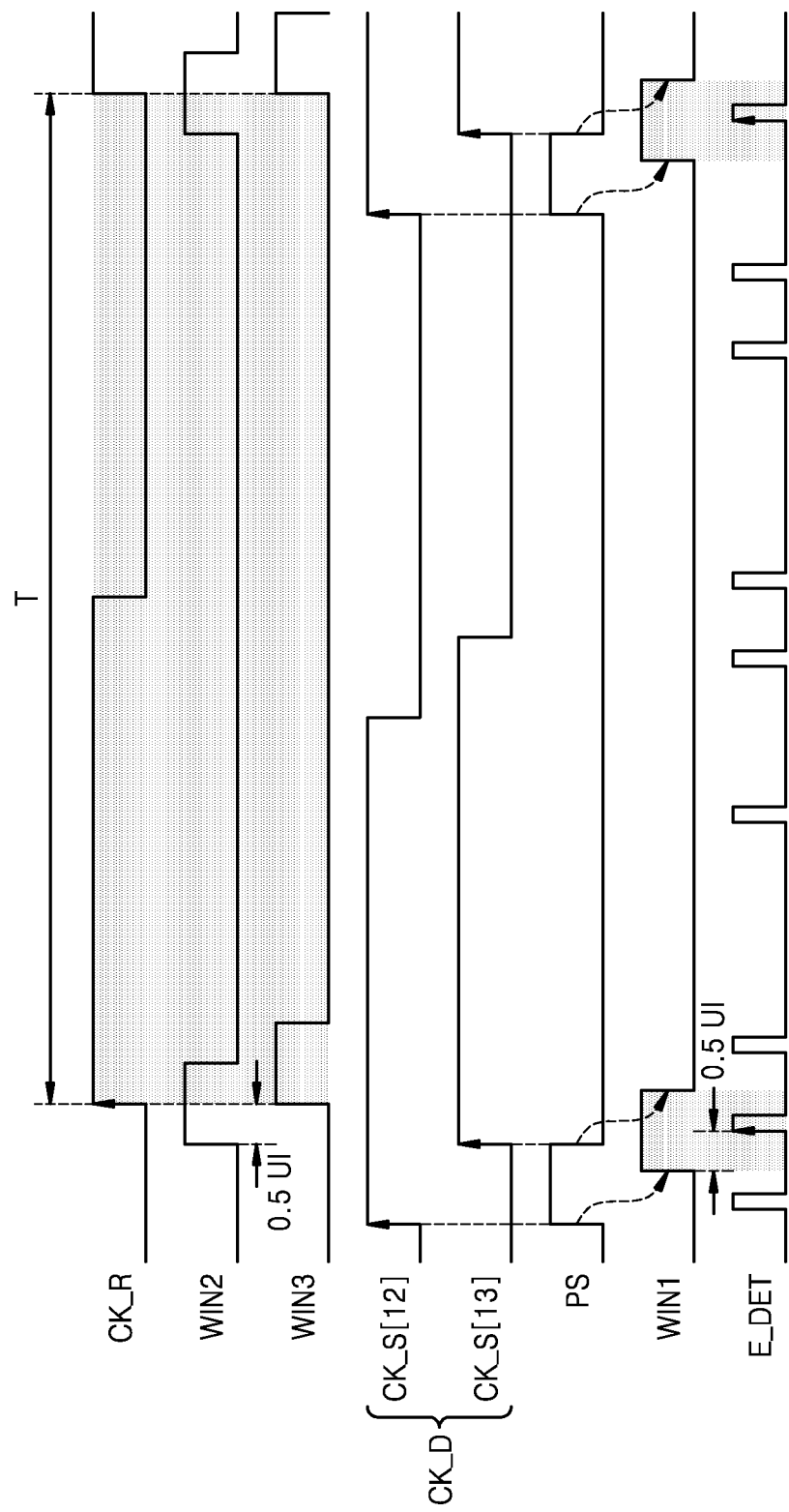
FIG. 9 illustrates a timing diagram of an example of the operation of a window generating circuit of FIG. 8 according to an embodiment of the inventive concepts.

FIG. 8 illustrates a block diagram of an example of the window generating circuit 160 of FIG. 1 according to an embodiment of the inventive concepts. FIG. 9 illustrates a timing diagram of an example of the operation of a window generating circuit 160' of FIG. 8 according to an embodiment of the inventive concepts. As described above with reference to FIG. 1, the window generating circuit 160' of FIG. 8 receives the recovery clock signal CK_R and the third window signal WIN3 and generates the first window signal WIN1, such that the phase of the recovery clock signal (CK_R) will be identical to that of the third window signal WIN3. As shown in FIG. 8, the window generating circuit 160' includes a pulse generator 162, a phase detector 164, and a window signal generator 166. In the examples shown in FIGS. 8 and 9, it is assumed that the window generating circuit 160' receives the third window signal WIN3 from the DLL circuit 140" of FIG. 7 and the third window signal WIN3 is delayed by 0.5 UI from the window signal WIN2.

Although not shown in FIG. 1, in embodiments the window generating circuit 160 may also receive at least one of a plurality of delayed clock signals CK_D from the DLL circuit 140 (e.g., DLL circuit 140"). The pulse generator 162 generates a pulse signal PS from the at least one of the plurality of delayed clock signals CK_D. The pulse signal PS may include an active pulse having a same width as an active pulse of a window signal (e.g., WIN1, WIN2, and WIN3 in FIG. 1). For example, as shown in FIG. 9, the pulse generator 162 may receive a twelfth sample clock signal CK_S[12] and a thirteenth sample clock signal (CK_S[13] as the at least one delayed clock signal CK_D, and generate a pulse signal PS having an active pulse width corresponding to a UI from rising edges of the twelfth sample clock signal CK_S[12] and the thirteenth sample clock signal CK_S[13]. As the pulse signal PS is delayed by the window signal generator 166, the first window signal WIN1 may be generated.

The phase detector 164 generates a phase detection signal PD by detecting a phase difference between the recovery clock signal CK_R and the third window signal WIN3. For example, the phase detector 164 may generate a phase detection signal PD corresponding to UP when the phase of the recovery clock signal CK_R leads the phase of the third window signal WIN3. Otherwise, a phase detection signal PD corresponding to DOWN may be generated. The phase detector 164 may be implemented in various forms and, in some embodiments, may be implemented as a "Bang-Bang" phase detector.

The window signal generator 166 receives the pulse signal PS from the pulse generator 162 and receives the phase detection signal PD from the phase detector 164. The window signal generator 166 generates the first window signal WIN1 by delaying the pulse signal PS based on the phase detection signal PD. For example, as shown in FIG. 9, the second window signal WIN2 may be generated by delaying the first window signal WIN1 (e.g., by the edge delay ED of FIG. 4), and the third window signal WIN3 may be generated by delaying the second window signal WIN2 by 0.5 UI. Therefore, when the window signal generator 166 generates the first window signal WIN1 such that the phase of the recovery clock signal CK_R is identical to that of the third window signal WIN3, the first window signal WIN1 may have a phase leading the corresponding edge of the edge detect signal E_DET indicated by the arrow (T) by 0.5 UI. As a result, an active pulse of the first window signal WIN1 having a width corresponding to the UI may have a correct timing to detect the corresponding edge of the edge detect signal E_DET indicated by the arrow (↑).

Figure 10:
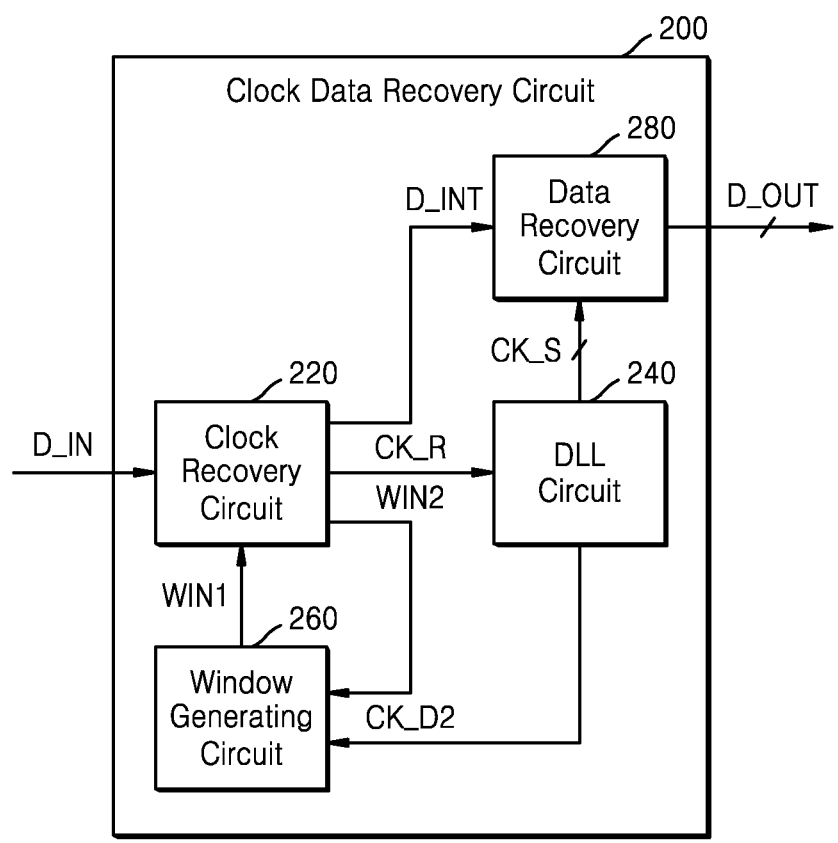
FIG. 10 illustrates a block diagram of a clock data recovery circuit according to another embodiment of the inventive concepts.
Figure 11:
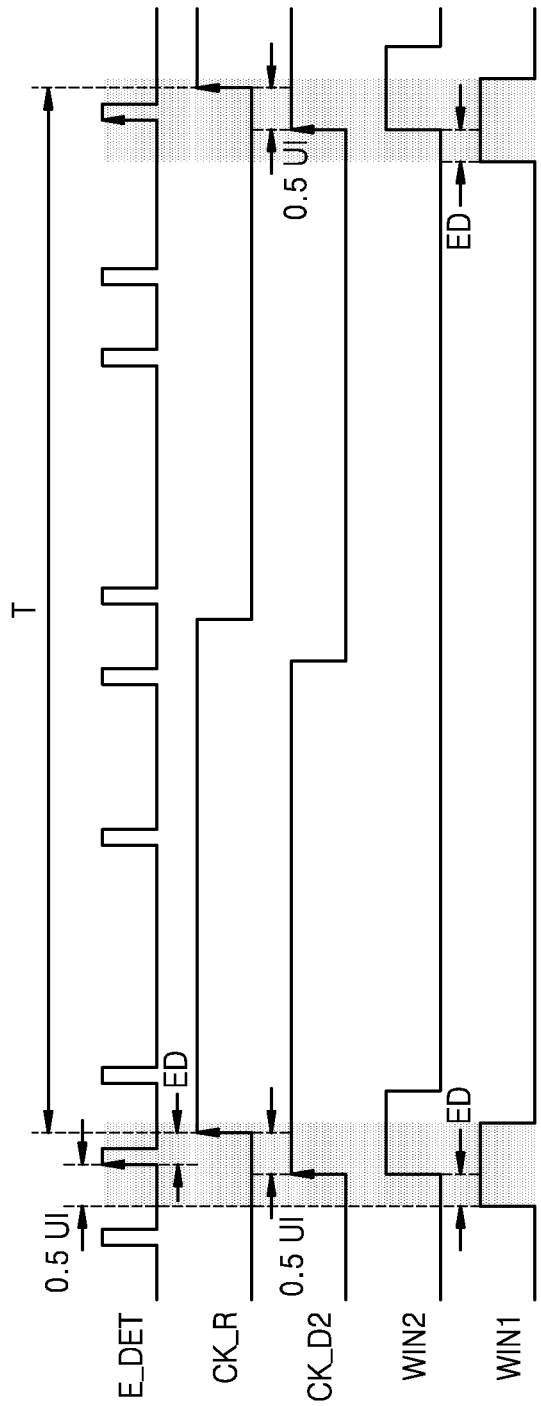
FIG. 11 illustrates a timing diagram of an example of the operation of a clock data recovery circuit of FIG. 10 according to an embodiment of the inventive concepts.

FIG. 10 illustrates a block diagram of a clock data recovery circuit 200 according to another embodiment of the inventive concepts. FIG. 11 illustrates a timing diagram of an example of the operation of the clock data recovery circuit 200 of FIG. 10 according to an embodiment of the inventive concepts. Compared to the clock data recovery circuit 100 of FIG. 1 that generates the first window signal WIN1 based on a phase difference between the recovery clock signal CK_R and the third window signal WIN3, the clock data recovery circuit 200 of FIG. 10 generates the first window signal WIN1 based on a phase difference between the second window signal WIN2 and a second delayed clock signal CK_D2 from among a plurality of delayed clock signals. As shown in FIG. 10, the clock data recovery circuit 200 includes a clock recovery circuit 220, a DLL circuit 240, a window generating circuit 260, and a data recovery circuit 280. Hereinafter, description identical to that given above with reference to FIG. 1 may be omitted.

The clock recovery circuit 220 receives the input data signal D_IN and the first window signal WIN1 and generates the recovery clock signal CK_R from the input data signal D_IN based on the first window signal WIN1. Furthermore, the clock recovery circuit 220 generates the second window signal WIN2 and the internal data signal D_INT synchronized with the recovery clock signal CK_R. For example, as shown in FIG. 11, the clock recovery circuit 220 generates the second window signal WIN2 by delaying the first window signal WIN1 by an edge delay ED from an edge of the edge detect signal E_DET to an edge of the recovery clock signal CK_R.

The DLL circuit 240 receives the recovery clock signal CK_R and detects a UI. The DLL circuit 240 generates a plurality of delayed clock signals CK_S and CK_D2 based on the detected UI, and the plurality of delayed clock signals CK_S and CK_D2 may include the sample clock signals CK_S and a second delayed clock signal CK_D2. The sample clock signals CK_S have phase differences equivalent to multiples of the UI with respect to one another, and the second delayed clock signal CK_D2 has a phase leading that of the recovery clock signal CK_R. For example, as shown in FIG. 11, the second delayed clock signal CK_D2 may have a phase leading that of the recovery clock signal CK_R by approximately 0.5 UI. In some embodiments, when the DLL circuit 240 includes a clock delay circuit identical to the clock delay circuit 142' of FIG. 7, the second delayed clock signal CK_D2 may be a thirteenth sample clock signal CK_S[13].

The window generating circuit 260 receives the second window signal WIN2 from the clock recovery circuit 220 and receives the second delayed clock signal CK_D2 from the DLL circuit 240. The window generating circuit 260 generates the first window signal WIN1, such that the phase of the second window signal WIN2 will be identical to the phase of the second delayed clock signal CK_D2. For example, as shown in FIG. 11, the second window signal WIN2 may be delayed by the edge delay ED from the first window signal WIN1 and, when the window generating circuit 260 generates the first window signal WIN1 such that the phase of the second window signal WIN2 is identical to that of the second delayed clock signal CK_D2, an active pulse of the first window signal WIN1 may occur at a time point leading the corresponding edge of the edge detect signal E_DET indicated by the arrow (T) by 0.5 UI, and thus an active pulse of the first window signal WIN1 may be formed in an interval including (overlapping) the corresponding edge of the edge detect signal E_DET indicated by the arrow (a). As a result, the clock recovery circuit 220 may accurately detect the corresponding edge from the edge detect signal E_DET indicated by the arrow (T) based on the first window signal WIN1 and generate the recovery clock signal CK_R. In some embodiments, the window generating circuit 260 may be identical or similar to the window generating circuit 160' of FIG. 8, wherein a phase detector included in the window generating circuit 260 may receive the second window signal WIN2 and the second delayed clock signal CK_D2. In other words, the DLL circuit 240 generates the second delayed clock signal CK_D2 as having a phase identical to a phase of the second window signal WIN2, based on the recovery clock signal CK_R provided by the clock recovery circuit 220 responsive to the first window signal WIN1 as provided to the clock recovery circuit 220 by the window generating circuit 260.

The data recovery circuit 280 receives the internal data signal D_INT from the clock recovery circuit 220 and receives the sample clock signals CK_S from the DLL circuit 240. The data recovery circuit 180 generates the output data signal D_OUT including parallel data from the internal data signal D_INT synchronized with the recovery clock signal CK_R and including the serial data, based on the sample clock signals CK_S.

Figure 12:
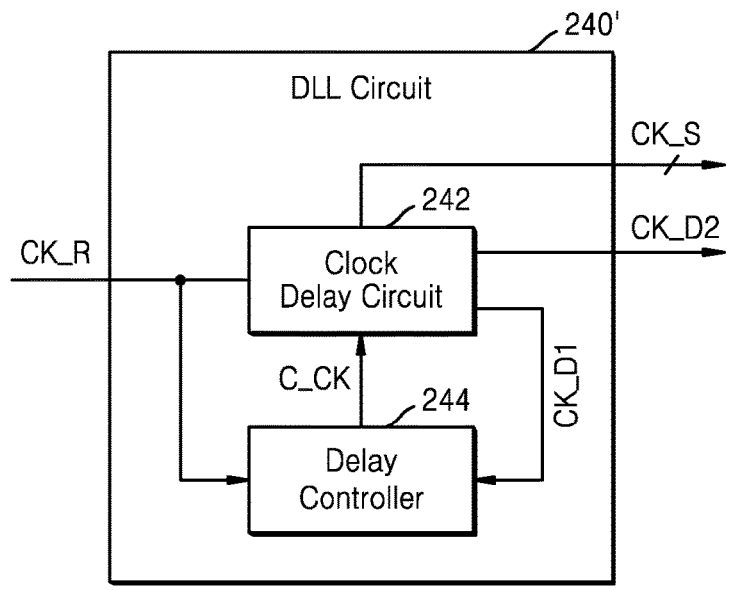
FIG. 12 illustrates a block diagram of an example of a DLL circuit of FIG. 10 according to an embodiment of the inventive concepts.

FIG. 12 illustrates a block diagram of an example of the DLL circuit 240 of FIG. 10 according to an embodiment of the inventive concepts. As described above with reference to FIG. 10, the DLL circuit 240' of FIG. 12 detects a UI from the recovery clock signal CK_R and generates a plurality of delayed clock signals CK_D1, CK_D2, and CK_S by delaying the recovery clock signal CK_R based on the detected UI. As shown in FIG. 12, the DLL circuit 240' includes a clock delay circuit 242 and a delay controller 244. Compared with the DLL circuit 140' of FIG. 5 and the DLL circuit 140" of FIG. 7, the second window delay circuits 146 and 146' may be omitted in the DLL circuit 240' of FIG. 12. Hereinafter, description of features of FIG. 12 similar to features already given above with reference to FIG. 5 may be omitted.

The clock delay circuit 242 generates the plurality of delayed clock signals CK_D1, CK_D2, and CK_S by delaying the recovery clock signal CK_R. For example, similar to the clock delay circuit 142' of FIG. 7, the clock delay circuit 242 may include a series of delay units that provide a delay adjusted according to the clock control signal C_CK, and the delay units may output the plurality of delayed clock signals CK_D1, CK_D2, and CK_S. The first delayed clock signal CK_D1 provided to the delay controller 244 may be a signal generated as the recovery clock signal CK_R is delayed by the series of delay units included in the clock delay circuit 242, and the second delayed clock signal CK_D2 may have a phase leading that of the first delayed clock signal CK_D1 by being delayed by at least some of the series of delay units. Furthermore, the sample clock signals CK_S may have phase differences equivalent to multiples of the UI with respect to one another.

The delay controller 244 generates the clock control signal C_CK, such that the phase of the recovery clock signal CK_R is identical to the phase of the first delayed clock signal CK_D1. Accordingly, the first delayed clock signal CK_D1 may have a same phase as the recovery clock signal CK_R, and the second delayed clock signal CK_D2 having a phase leading the first delayed clock signal CK_D1 may have a phase leading the phase of the recovery clock signal CK_R. As described above with reference to FIGS. 10 and 11, the first window signal WIN1 may be generated, such that the second delayed clock signal CK_D2 having a phase leading the phase of the recovery clock signal CK_R (e.g., by 0.5 UI) and the second window signal WIN2 have a same phase.

Figure 13:
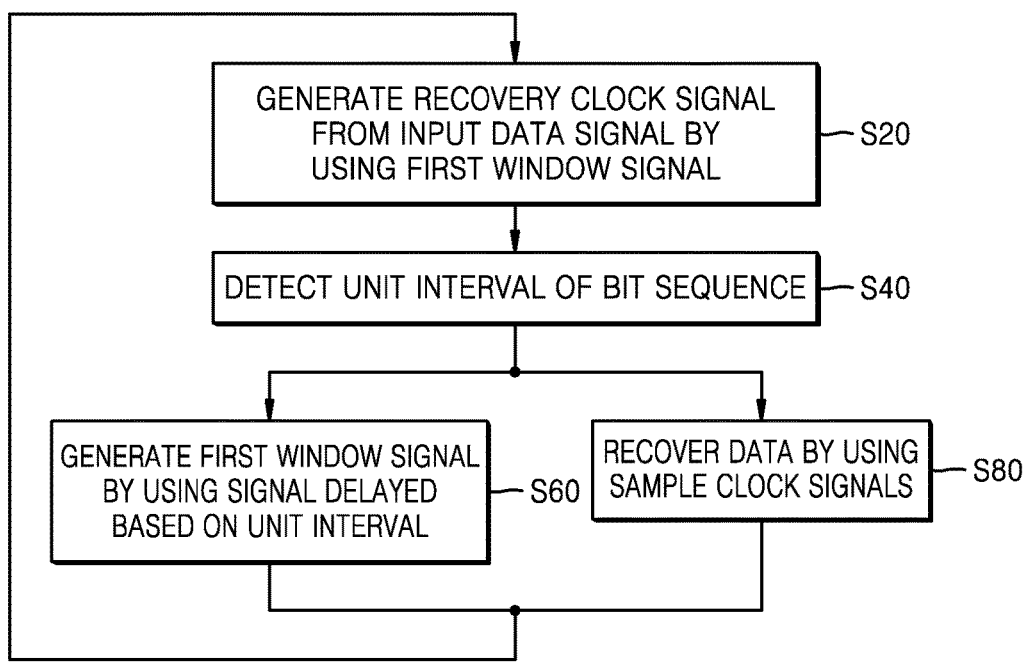
FIG. 13 illustrates a flowchart of a method of recovering a clock and data according to an embodiment of the inventive concepts.

FIG. 13 illustrates a flowchart of a method of recovering a clock and data according to an embodiment of the inventive concepts. In some embodiments, the method of recovering a clock and data of FIG. 13 may be performed by the clock data recovery circuit 100 of FIG. 1 or by the clock data recovery circuit 200 of FIG. 10 and may also be referred to as a method of operating a clock data recovery circuit. As shown in FIG. 13, the method of recovering a clock and data may include a plurality of operations S20, S40, S60, and S80 and, hereinafter, FIG. 13 will be described with reference to FIGS. 1 and 10.

In operation S20, an operation for generating the recovery clock signal CK_R from an input data signal D_IN by using the first window signal WIN1 is performed. For example, the clock recovery circuit 120 of FIG. 1 may detect edges of the input data signal D_IN and extract periodic edges from among the detected edges based on the first window signal WIN1. The clock recovery circuit 120 may generate the recovery clock signal CK_R by using the extracted periodic edges. In some embodiments, the recovery clock signal CK_R may have a period identical to the duration of a packet of the input data signal D_IN.

In operation S40, an operation for detecting a UI of a bit sequence is performed. For example, the DLL circuit 140 of FIG. 1 may detect a UI from the recovery clock signal CK_R. In some embodiments, as shown in FIG. 1, the detected UI may be used to generate the sample clock signals CK_S and the third window signal WIN3. In some embodiments, as shown in FIG. 1, the detected UI may be used to generate sample clock signals CK_S and a second delayed window signal CK_D2. An example of operation S40 will be described below with reference to FIG. 14. As shown in FIG. 13, following operation S40, operations S60 and S80 are performed in parallel.

In operation S60, an operation for generating the first window signal WIN1 by using a signal delayed based on the UI is performed. In some embodiments, as described above with reference to FIG. 1, the window generating circuit 160 may generate the first window signal WIN1 by using the third window signal WIN3, which is generated by delaying the second window signal WIN2 by the window delay WD by the DLL circuit 140. In some embodiments, as described above with reference to FIG. 10, the window generating circuit 260 may delay the recovery clock signal CK_R by the DLL circuit 240, thereby generating the first window signal WIN1 by using the second delayed clock signal CK_D2 having a phase leading that of the recovery clock signal CK_R. Therefore, the timing of the first window signal WIN1 may be accurately decided by the detected UI and may be adaptively decided according to the variation of the input data signal D_IN. Examples of operation S60 will be described below with reference to FIGS. 15A and 15B.

In operation S80, an operation for recovering data by using the sample clock signals CK_S is performed. For example, the sample clock signals CK_S generated by the DLL circuit 140 of FIG. 1 may have phase differences with respect to one another equivalent to multiples of the UI, and the data recovery circuit 180 may generate the output data signal D_OUT including parallel data by sampling the internal data signal D_INT synchronized with the recovery clock signal CK_R according to the sample clock signals CK_S.

Figure 14:
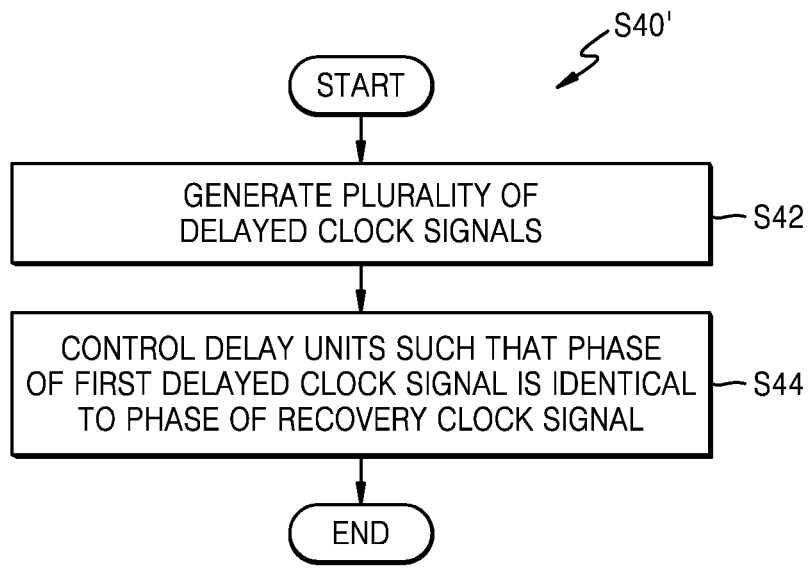
FIG. 14 illustrates a flowchart of an example of operation S40 of FIG. 13 according to an embodiment of the inventive concepts.

FIG. 14 illustrates a flowchart of an example of operation S40 of FIG. 13 according to an embodiment of the inventive concepts. As described above with reference to FIG. 13, an operation for detecting the UI of a bit sequence may be performed in operation S40' of FIG. 14. In some embodiments, operation S40' may be performed by the DLL circuit 140 of FIG. 1 or by the DLL circuit 240 of FIG. 10 and, hereinafter, FIG. 14 will be described with reference to FIGS. 1 and 10.

In operation S42, an operation for generating a plurality of delayed clock signals is performed. For example, the DLL circuit 140 of FIG. 1 may generate a plurality of delayed clock signals by delaying the recovery clock signal CK_R, and the plurality of delayed clock signals may include the first delayed clock signal CK_D1 and the sample clock signals CK_S. The first delayed clock signal CK_D1 may be generated as the recovery clock signal CK_R passes through a series of delay units of a clock delay circuit (e.g., 142 of FIG. 5) of the DLL circuit 140, wherein the phase of the first delayed clock signal CK_D1 is compared with the phase of the recovery clock signal CK_R in the following operation S44.

In operation S44, an operation for controlling the delay units is performed, such that the phase of the first delayed clock signal CK_D1 is identical with that of the recovery clock signal CK_R. For example, a delay controller (e.g., 144 of FIG. 5) of the DLL circuit 140 of FIG. 1 may include a phase detector and may generate a control signal for controlling a series of delay units such that the phase of the first delayed clock signal CK_D1 is identical to the phase of the recovery clock signal CK_R. Therefore, the phase of the first delayed clock signal CK_D1 may be identical to that of the recovery clock signal CK_R, and a delay provided by the series of delay units may be identical to the duration T of a packet of the input data signal D_IN (or a multiple of the duration T).

When a series of delay units have a same structure and receive a control signal in common, a delay corresponding to the UI may be provided by some of the series of delay units (e.g., k delay units), and thus a control signal for providing the delay corresponding to the UI is decided (i.e., determined). As a result, the UI may be detected. As described above with reference to FIG. 13, a signal delayed based on the unit interval UI in operation S60, which is performed subsequent to operation S40', may be generated based on the decided control signal.

Figure 15A:
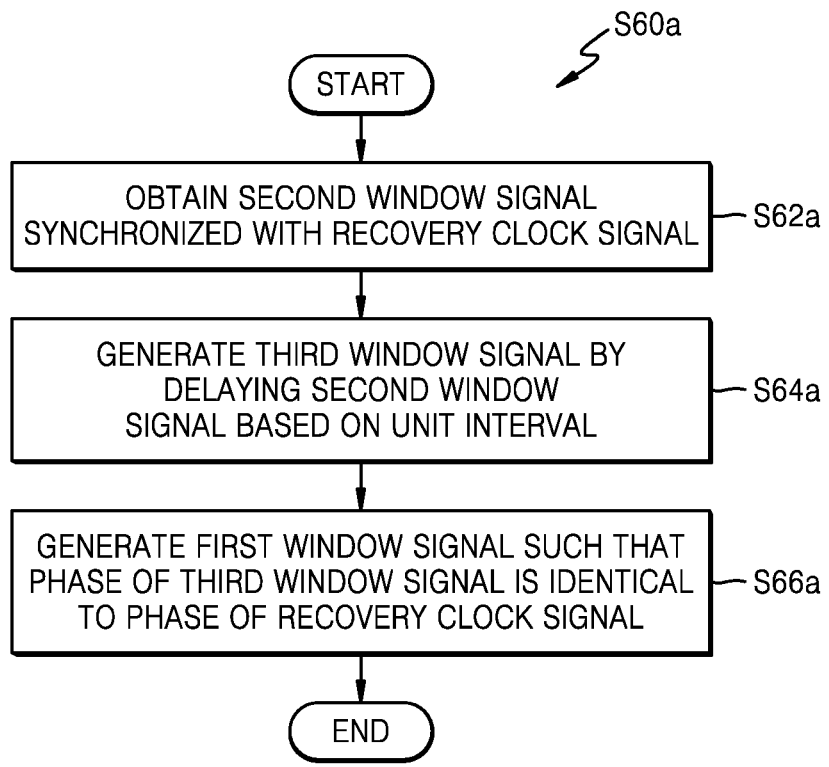
FIG. 15A illustrates a flowchart of an example of operation S60 of FIG. 13 according to an embodiment of the inventive concepts.
Figure 15B:
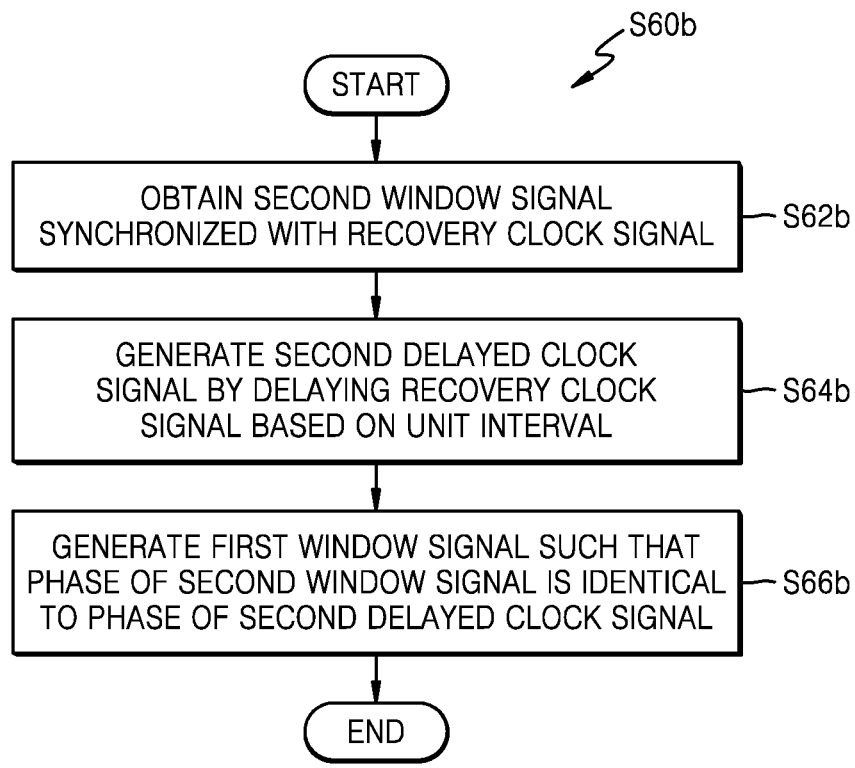
FIG. 15B illustrates a flowchart of another example of operation S60 of FIG. 13 according to an embodiment of the inventive concepts.

FIG. 15A illustrates a flowchart of an example of operation S60 of FIG. 13 according to embodiments of the inventive concepts. FIG. 15B illustrates a flowchart of another example of operation S60 of FIG. 13 according to embodiments of the inventive concepts. As described above with reference to FIG. 13, in operations S60a and S60b shown in FIGS. 15A and 15B, an operation for generating the first window signal WIN1 by using a delayed signal based on a UI is performed. In some embodiments, operation S60a of FIG. 15A may be performed by the DLL circuit 140 and the window generating circuit 160 of FIG. 1. Also, in some embodiments, operation S60b of FIG. 15B may be performed by the DLL circuit 240 and the window generating circuit 260 of FIG. 10. Hereafter, FIGS. 15A and 15B will be described with reference to FIGS. 1 and 10. However, description identical to that already given may be omitted from the following.

Referring to FIG. 15A, operation S60a includes a plurality of operations S62a, S64a, and S66a. In operation S62a, an operation for obtaining the second window signal WIN2 synchronized with the recovery clock signal CK_R is performed. For example, the clock recovery circuit 120 of FIG. 1 generates the second window signal WIN2 by delaying the first window signal WIN1, and the DLL circuit 140 receives the second window signal WIN2 from the clock recovery circuit 120.

In operation S64a, an operation for generating the third window signal WIN3 by delaying the second window signal WIN2 based on a UI is performed. For example, the UI may be detected in operation S40 of FIG. 13, and the DLL circuit 140 of FIG. 1 delays the second window signal WIN2 according to an interval proportional to the UI, thereby generating the third window signal WIN3. In some embodiments, the third window signal WIN3 may be generated by delaying the second window signal WIN2 by 0.5 UI.

In operation S66a, an operation for generating the first window signal WIN1 such that the phase of the third window signal WIN3 is identical to that of the recovery clock signal CK_R is performed. For example, the window generating circuit 160 of FIG. 1 may detect a phase difference between the recovery clock signal CK_R and the third window signal WIN3 and may generate the first window signal WIN1, such that the detected phase difference between the recovery clock signal CK_R and the third window signal WIN3 becomes zero (0). Since the third window signal WIN3 is a signal generated by delaying the second window signal WIN2 synchronized with the recovery window signal CK_R based on the UI, the first window signal WIN1 may lead the edge of the input data signal D_IN (or the edge of the edge detect signal E_DET of FIG. 4) as much as the delay of the third window signal WIN3 from the second window signal WIN2. Therefore, the timing of the first window signal WIN1 may be decided based on the detected UI independently of a process voltage temperature (PVT) and a transmission rate, and may be decided adaptively with respect to the variation of the input data signal D_IN.

Referring to FIG. 15B, operation S60b includes a plurality of operations S62b, S64b, and S66b. In operation S62b, an operation for obtaining the second window signal WIN2 synchronized with the recovery clock signal CK_R is performed. For example, the clock recovery circuit 220 of FIG. 10 generates the second window signal WIN2 by delaying the first window signal WIN1, and the window generating circuit 260 receives the second window signal WIN2 from the clock recovery circuit 220.

In operation S64b, an operation for generating the second delayed clock signal CK_D2 by delaying the recovery clock signal CK_R based on the UI is performed. For example, the UI may be detected in operation S40 of FIG. 13, and the DLL circuit 240 of FIG. 1 delays the recovery clock signal CK_R according to an interval proportional to the UI, thereby generating the second delayed clock signal CK_D2. In some embodiments, the second delayed clock signal CK_D2 may be generated by delaying the recovery clock signal CK_R by an interval, which is identical to a multiple of the UI and is 0.5 UI shorter than the duration T of a packet. In other words, the second delayed clock signal CK_D2 may have a phase that leads the phase of the recovery clock signal CK_R by 0.5 UI.

In operation S66b, an operation for generating the first window signal WIN1 such that the phase of the second window signal WIN2 is identical to that of the second delayed clock signal CK_D2 is performed. For example, the window generating circuit 260 of FIG. 1 may detect a phase difference between the second window signal WIN2 and the second delayed clock signal CK_D2 and may generate the first window signal WIN1, such that the detected phase difference between the second window signal WIN2 and the second delayed clock signal CK_D2 becomes zero (0). Since the second delayed clock signal CK_D2 has a phase leading the recovery clock signal CK_R, and the second window signal WIN2 is a signal synchronized with the recovery clock signal CK_R, the first window signal WIN1 may be a signal leading the edge of the input data signal D_IN (or the edge of the edge detect signal E_DET of FIG. 4) by the phase difference between the signal CK_D2 and the recovery clock signal CK_R. Therefore, the timing of the first window signal WIN1 may be decided based on the detected UI independently of a process voltage temperature (PVT) and a transmission rate, and may be decided adaptively with respect to the variation of the input data signal D_IN.

Figure 16:
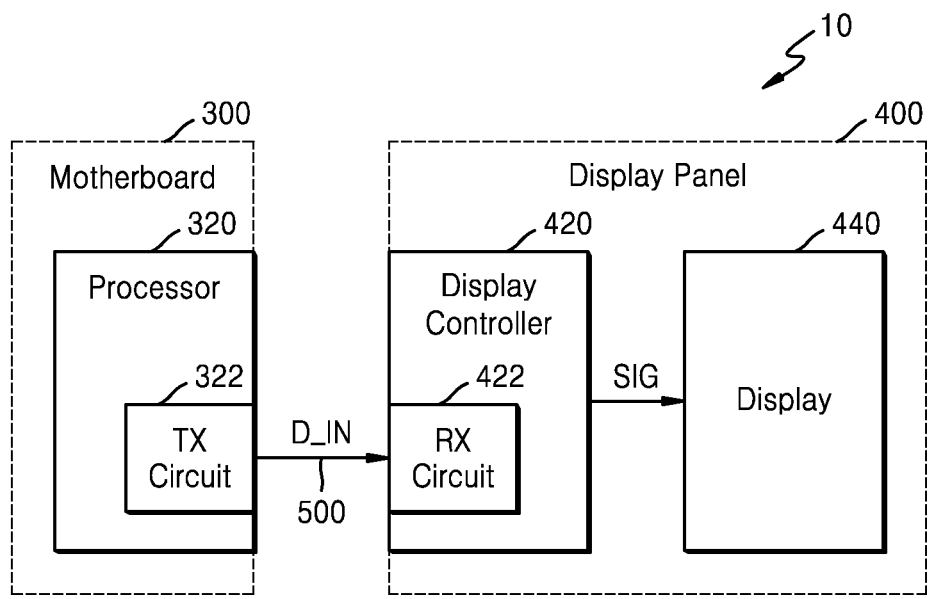
FIG. 16 illustrates a block diagram of an apparatus including a clock data recovery circuit according to an embodiment of the inventive concepts.

FIG. 16 illustrates a block diagram of an apparatus 10 including a clock data recovery circuit according to an embodiment of the inventive concepts. The clock data recovery circuit according to an example embodiment may be included in a receiving circuit 422. The apparatus 10 may be a computing system including a display panel 400 and may be, but is not limited to, a stationary system including for example a desktop computer, a server, a TV, a billboard or the like, or a mobile system such as for example a laptop computer, a tablet PC, a wearable device or the like. As shown in FIG. 16, the apparatus 10 may include a motherboard 300 and the display panel 400, wherein the input data signal D_IN may be transmitted from the motherboard 300 to the display panel 400 through a data line 500.

The motherboard 300 may include a processor 320, and the processor 320 may include a transmitting circuit 322. The processor 320 may refer to a processing unit that performs computational operations, e.g., a microprocessor, a microcontroller, an application specific integrated circuit (ASIC), or a field programmable gate array (FPGA). In some embodiments, the processor 320 may also be a video graphics processor, such as a graphic processing unit (GPU). The processor 320 may generate image data corresponding to an image output through a display 440 included in the display panel 400 and the image data may be provided to the transmitting circuit 322.

The transmitting circuit 322 may receive the image data and generate the input data signal D_IN by converting the image data to serial data. For example, the transmitting circuit 322 may generate the input data signal D_IN such that pixel data corresponding to one pixel of the display 440 corresponds to one packet. As described above with reference to FIG. 1, the input data signal D_IN may include an embedded clock and may include, for example, periodic edges occurring at the boundaries of a packet.

The display panel 400 may include a display controller 420 and the display 440. The display controller 420 may receive the input data signal D_IN including serial data from the motherboard 300 and process the input data signal D_IN, thereby providing a display signal SIG to the display 440. In some embodiments, the display controller 420 may provide the display signal SIG for controlling pixels included in the display 440 and may also be referred to as a display driver IC (DDIC).

The display controller 420 may include the receiving circuit 422 and the receiving circuit 422 may receive the input data signal D_IN. The receiving circuit 422 may include a clock data recovery circuit according to embodiments of the inventive concepts and may recover a clock and data from the input data signal D_IN. An amount of data transmitted from the motherboard 300 to the display panel 400 may increase significantly as the resolution of the display 440 increases and the number of images updated through the display 440 increases. For high-speed transmission of data, an interval of bits included in the input data signal D_IN, that is the UI, may be shortened, and it would thus be necessary to accurately recover a clock and data from the input data signal D_IN.

As described above, according to embodiments of the inventive concepts, the clock data recovery circuit included in the receiving circuit 422 may decide the timing of a window signal used to extract periodic edges included in the input data signal D_IN independently of a process voltage temperature (PVT) and a transmission rate, and adaptively with respect to the input data signal D_IN. For example, a window signal may be generated by using a signal delayed based on the UI detected from the input data signal D_IN.

The display 440 may include, but is not limited to, an arbitrary type of display such as for example a liquid crystal display (LCD), a light-emitting diode (LED), an electroluminescent display (ELD), a cathode ray tube (CRT), a plasma display panel (PDP), a liquid crystal on silicon (LCoS) or the like. Furthermore, although FIG. 16 shows that the apparatus 10 includes one display panel 400, in some embodiments the apparatus 10 may include two or more display panels, i.e., two or more displays.

While the inventive concepts have been particularly shown and described with reference to embodiments thereof, it should be understood that various changes in form and detail may be made therein without departing from the spirit and scope of the following claims.

What is claimed is:

1. A clock data recovery circuit that receives an input data signal including an embedded clock, the clock data recovery circuit comprising:
    a clock recovery circuit configured to generate a recovery clock signal from the input data signal based on a first window signal and to generate a second window signal synchronized with the recovery clock signal from the first window signal;
    a delayed locked loop circuit configured to detect a unit interval corresponding to one bit of the input data signal based on the recovery clock signal and to generate a third window signal by delaying the second window signal based on the unit interval; and
    a window generating circuit configured to generate the first window signal based on the third window signal and the recovery clock signal, so that a phase of the recovery clock signal is identical to a phase of the third window signal.

2. The clock data recovery circuit of claim 1, wherein a phase of the first window signal leads the phase of the recovery clock signal by approximately half of the unit interval.

3. The clock data recovery circuit of claim 1, wherein the clock recovery circuit comprises:
    an edge detector configured to generate an edge detect signal by detecting edges of the input data signal;
    a clock generator configured to generate the recovery clock signal by extracting an edge, from among the detected edges, that overlap an active interval of the first window signal; and
    a window delay circuit configured to generate the second window signal by delaying the first window signal by a phase difference between a phase of the edge detect signal and the phase of the recovery clock signal.

4. The clock data recovery circuit of claim 1, wherein the delayed locked loop circuit comprises:
    a clock delay circuit configured to delay the recovery clock signal based on a control signal to thereby generate a plurality of delayed clock signals;
    a delay controller configured to generate the control signal, wherein the clock delay circuit is configured to generate a first delayed clock signal, from among the plurality of delayed clock signals, as having a phase identical to the phase of the recovery clock signal; and a window delay circuit configured to generate the third window signal from the second window signal based on the control signal.

5. The clock data recovery circuit of claim 4, wherein the clock delay circuit comprises a series of delay units configured to receive the recovery clock signal, and the window delay circuit comprises at least one delay unit identical to each of the delay units of the series of delay units.

6. The clock data recovery circuit of claim 4, wherein the window generating circuit comprises:

a pulse generator configured to generate a pulse signal based on at least one of the plurality of delayed clock signals;

a phase detector configured to detect a phase difference between the phase of the recovery clock signal and the phase of the third window signal; and a window signal generator configured to generate the first window signal by delaying the pulse signal based on the detected phase difference.

7. The clock data recovery circuit of claim 4, wherein the clock recovery circuit comprises a data delay circuit configured to generate an internal data signal synchronized with the recovery clock signal from the input data signal, and the plurality of delayed clock signals comprise a plurality of sample clock signals having phase differences with respect to each other equivalent to multiples of the unit interval, and the clock data recovery circuit further comprising a data recovery circuit configured to generate an output data signal by sampling the internal data signal based on the plurality of sample clock signals.

8. A clock data recovery circuit that receives an input data signal including an embedded clock, the clock data recovery circuit comprising:

a clock recovery circuit configured to generate a recovery clock signal by extracting periodic edges from the input data signal based on a first window signal and to generate a second window signal synchronized with the recovery clock signal from the first window signal;

a delayed locked loop circuit configured to detect a unit interval corresponding to one bit of the input data signal based on the recovery clock signal and to generate a plurality of delayed clock signals by delaying the recovery clock signal; and a window generating circuit configured to generate the first window signal based on the second window signal and a delayed clock signal from among the plurality of delayed clock signals, so that a phase of the second window signal is identical to a phase of the delayed clock signal.

9. The clock data recovery circuit of claim 8, wherein the phase of the delayed clock signal leads a phase of the recovery clock signal by approximately half of the unit interval.

10. The clock data recovery circuit of claim 8, wherein the clock recovery circuit comprises:

an edge detector configured to generate an edge detect signal by detecting edges of the input data signal;

a clock generator configured to generate the recovery clock signal by detecting an edge, from among the detected edges, that overlaps an active interval of the first window signal; and a window delay circuit configured to generate the second window signal by delaying the first window signal by a phase difference between a phase of the edge detect signal and a phase of the recovery clock signal.

11. The clock data recovery circuit of claim 8, wherein the delayed locked loop circuit comprises:

a clock delay circuit configured to delay the recovery clock signal based on a control signal to thereby generate the plurality of delayed clock signals; and a delay controller configured to generate the control signal, wherein the clock delay circuit is configured to generate a first delayed clock signal, from among the plurality of delayed clock signals, as having a phase identical to a phase of the recovery clock signal.

12. The clock data recovery circuit of claim 11, wherein the window generating circuit comprises:

a pulse generator configured to generate a pulse signal based on at least one of the plurality of delayed clock signals;

a phase detector configured to detect a phase difference between the phase of the second window signal and the phase of the delayed clock signal; and a window signal generator configured to generate the first window signal by delaying the pulse signal based on the detected phase difference.

13. A method of recovering a clock and data from an input data signal including an embedded clock, the method comprising:

generating a recovery clock signal from the input data signal based on a first window signal;

detecting a unit interval corresponding to one bit of the input data signal based on the recovery clock signal;

delaying a signal synchronized with the recovery clock signal based on the unit interval to provide a delayed signal; and generating the first window signal based on the delayed signal.

14. The method of claim 13, further comprising:

generating a second window signal synchronized with the recovery clock signal from the first window signal, wherein the delaying the signal synchronized with the recovery clock signal comprises generating a third window signal as the delayed signal by delaying the second window signal based on the unit interval, and the generating the first window signal comprises generating the first window signal based on the recovery clock signal and the third window signal.

15. The method of claim 14, wherein the generating the first window signal comprises:

detecting a phase difference between a phase of the recovery clock signal and a phase of the third window signal; and generating the first window signal so that the phase difference is zero.

16. The method of claim 14, wherein the generating the third window signal comprises generating the third window signal by delaying the second window signal by approximately half of the unit interval.

17. The method of claim 13, further comprising generating a second window signal synchronized with the recovery clock signal from the first window signal, wherein the delaying the signal synchronized with the recovery clock signal comprises generating a delayed clock signal as the delayed signal by delaying the recovery clock signal based on the unit interval, and the generating the first window signal comprises generating the first window signal based on the second window signal and the delayed clock signal.

18. The method of claim 17, wherein the generating the first window signal comprises:
    detecting a phase difference between a phase of the second window signal and a phase of the second delayed clock signal; and
    generating the first window signal so that the phase difference is zero.

19. The method of claim 17, wherein the generating the delayed clock signal comprises generating the delayed clock signal that precedes the recovery clock signal by approximately half of the unit interval.

20. The method of claim 13, wherein the detecting the unit interval comprises:
    generating a plurality of delayed clock signals by passing the recovery clock signal through a series of delay units; and
    controlling the series of delay units so that a phase of a first delayed clock signal from among the plurality of delayed clock signals is identical to a phase of the recovery clock signal.

* * * * *